(12) United States Patent
Mefferd et al.

(10) Patent No.: US 7,408,970 B2
(45) Date of Patent: Aug. 5, 2008

(54) OPTICALLY PUMPED EXTERNAL-CAVITY SEMICONDUCTOR LASER WITH MULTIPLE GAIN STRUCTURES

(75) Inventors: Wayne S. Mefferd, Los Altos Hills, CA (US); Juan L. Chilla, Sunnyvale, CA (US)

(73) Assignee: Coherent, Inc., Santa Clara, CA (US)

( * ) Notice: Subject to any disclaimer, the term of this patent is extended or adjusted under 35 U.S.C. 154(b) by 276 days.

(21) Appl. No.: 11/124,319

(22) Filed: May 6, 2005

(65) Prior Publication Data

US 2006/0251141 A1    Nov. 9, 2006

(51) Int. Cl.
*H01S 3/091*    (2006.01)
(52) U.S. Cl. .......................... 372/70; 372/68
(58) Field of Classification Search .............. 372/38.06, 372/43.01, 68, 70, 93, 107, 96, 36, 45.01, 372/97
See application file for complete search history.

(56) References Cited

U.S. PATENT DOCUMENTS

| 5,052,017 | A | | 9/1991 | Hobart et al. .................. 372/99 |
| 5,131,002 | A | * | 7/1992 | Mooradian ................ 372/50.12 |
| 5,659,563 | A | | 8/1997 | Reed et al. .................... 372/101 |
| 5,926,494 | A | | 7/1999 | Pepper ......................... 372/70 |
| 6,097,742 | A | * | 8/2000 | Caprara et al. ................. 372/22 |
| 6,438,152 | B2 | * | 8/2002 | Contag et al. .................. 372/70 |
| 6,856,640 | B2 | * | 2/2005 | Henrich et al. ................ 372/97 |
| 2004/0179559 | A1 | * | 9/2004 | Butterworth et al. ........... 372/21 |

* cited by examiner

*Primary Examiner*—Leonardo Andujar
*Assistant Examiner*—Fei Fei Yeung Lopez
(74) *Attorney, Agent, or Firm*—Stallman & Pollock LLP

(57) ABSTRACT

A laser-resonator terminated by two end mirrors is folded by a plurality of OPS-structures and a plurality of fold-mirrors. The OPS-structures are energized by focused radiation from diode-laser bars. The fold-mirrors are configured and arranged with respect to the OPS-structures and the end-mirrors such that a beam of laser radiation circulating in the resonator has about the same dimensions on each OPS-structure.

14 Claims, 6 Drawing Sheets

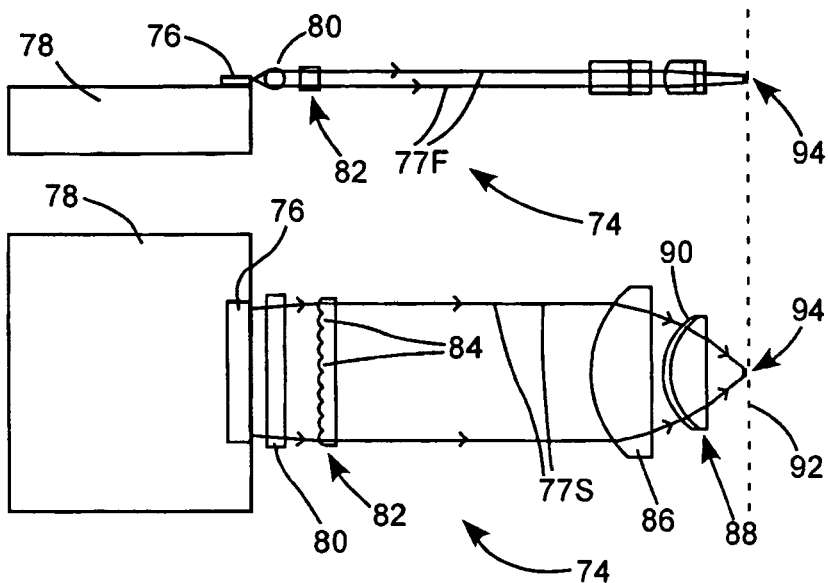
FIG. 6A
FIG. 6B
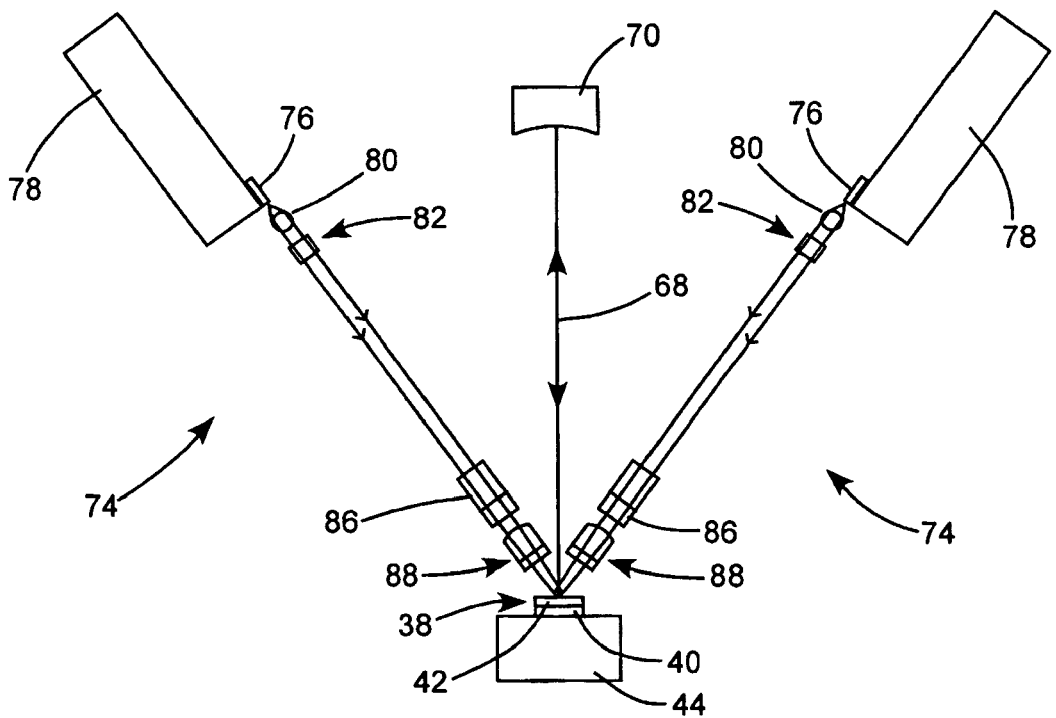
FIG. 7

OPTICALLY PUMPED EXTERNAL-CAVITY SEMICONDUCTOR LASER WITH MULTIPLE GAIN STRUCTURES

TECHNICAL FIELD OF THE INVENTION

The present invention relates in general to external-cavity, optically pumped semiconductor lasers (OPS-lasers). The invention relates in particular to OPS-lasers including two or more semiconductor multilayer gain-structures.

DISCUSSION OF BACKGROUND ART

The term OPS-lasers, as used herein, refers to a class of vertical-cavity surface-emitting semiconductor lasers wherein optical gain is provided by recombination of electrical carriers in very thin layers, for example, about 15 nanometers (nm) or less, of a semiconductor material. These layers are generally termed quantum-well (QW) layers or active layers.

In an OPS-laser, several QW layers, for example, about fifteen, are spaced apart by separator layers also of a semiconductor material, but having a higher conduction band energy that the QW layers. This combination of active layers and separator layers may be defined as the gain-structure of the OPS-laser. The layers of the gain-structure are epitaxially grown. On the gain-structure is an epitaxially-grown multilayer mirror-structure, often referred to as a Bragg mirror. The combination of mirror-structure and gain-structure is referred to hereinafter as an OPS-structure or an OPS-chip.

In an (external cavity) OPS-laser, another (conventional) mirror, serving as an output-coupling mirror is spaced-apart from the OPS-chip, thereby forming a resonant cavity with the mirror-structure of the OPS-structure. The resonant cavity, accordingly, includes the gain-structure of the OPS-chip. The mirror-structure and gain-structure are arranged such that QW layers of the gain-structure are spaced apart by one half-wavelength of the fundamental laser wavelength, and correspond in position with antinodes of a standing-wave of the fundamental laser-radiation in the resonator. The fundamental-wavelength is characteristic of the composition of the material of the QW layers.

Optical pump-radiation (pump-light) preferably from a diode-laser or a diode-laser array (diode-laser bar) is directed into the gain-structure of the OPS-chip and is absorbed by the separator layers of the gain-structure, thereby generating electrical-carriers. The electrical-carriers are trapped in the QW layers of the gain-structure and recombine. Recombination of the electrical-carriers in the QW layers yields electromagnetic radiation of the fundamental-wavelength. This radiation circulates in the resonator and is amplified by the gain-structure thereby generating laser-radiation.

The OPS-laser allows for highly efficient conversion of the low quality, low brightness output of diode-laser bars into a high quality OPS-laser output beam that is both spectrally and spatially near transform limited at power levels of about 10 Watts (W) or greater. Simple thermal area scaling, coupled with semiconductor material improvements, diamond facecooling of the chip, and improvements in pump light delivering arrangements may permit as much as a 100 W of fundamental output from an OPS laser having only a single OPS-chip. If higher power output is desired than can be provided by a single OPS-chip, however, it will be necessary to provide an OPS-laser including two or more OPS-chips.

U.S. Pat. No. 5,131,002 describes an OPS-laser in which a beam circulating in a laser resonator is caused to make multiple interactions with an OPS-chip having an extended area. This provides the effect of a resonator including multiple individual OPS-chips. This arrangement is depicted schematically in FIG. 1, which, here, is reproduced from a drawing in the '002 patent, with certain elements omitted that are not necessary for understanding a basic principle of the disclosed laser. The laser 10 includes a resonator 12 formed between a highly reflective end mirror 14 and a partially reflective, partially transmissive, output-coupling mirror 16. Circulating radiation in resonator 12 is schematically depicted by long-dashed lines 18.

Included in resonator 12 is an extended OPS-chip 20 including a mirror structure 22 surmounted by a gain-structure 24. An extended, plane reflector 26 is arranged face-to-face with extended OPS-chip 20. Mirrors 14 and 16 of resonator 12 are arranged such that circulating fundamental radiation 18 propagates in a zigzag fashion in the resonator, being reflected alternately from the extended reflector 26 and the mirror structure 22 of the extended OPS-chip. The circulating radiation is incident on extended OPS-chip 20 in areas 28A, 28B, and 28C thereof. Pump light, indicated by short-dashed lines 30, is directed onto areas 28A, 28B, and 28C of the OPS-chip by pump-light sources 32A, 32B and 32C respectively. The pump-light sources are driven by a common power supply 34.

One significant practical problem with the arrangement of laser 10 is that the areas on which the circulating radiation is incident, while originally depicted in the '002 patent as being about equal (presumably for convenience of illustration) would in fact be different. These areas could vary by a factor of four or more (from the largest to the smallest) if the resonator were configured as a stable resonator. This would mean that each pump light delivery system would need to be differently configured in order to avoid inefficiency of pump-light energy coupling into the circulating-radiation. Other practical problems would be encountered in efficiently cooling the extended area of OPS chip 20, and in maintaining an adequate flatness of the chip over the extended area. Changes in flatness during use would cause the actual location of areas 28A-C to change and become misaligned with the location of delivered pump light. This would further decrease optical pumping efficiency.

U.S. Pat. No. 6,097,742 describes a variety of external-cavity OPS-lasers one of which includes two separate OPS-chips. This embodiment is depicted schematically in FIG. 2. Here, the OPS-laser 36 includes OPS-chips 38A and 38B, each of which has a mirror structure 40 surmounted by a gain structure 42. Each OPS-chip is mounted on a dedicated heat sink 44. Laser 36 includes a laser-resonator 37 formed between mirror-structure 40 of OPS-chip 38A and a plane mirror 46. The resonator is folded by mirror-structure 40 of OPS-chip 38A and by a concave mirror 48. Fundamental radiation indicated by arrows F circulates in resonator 37 generally along a longitudinal axis 50 of the resonator as indicated by single arrowheads F. A birefringent filter 52 is included in the resonator for selecting a wavelength of the circulating radiation within the gain-bandwidth of the OPS-gain structures. An optically nonlinear crystal 54 is located adjacent mirror 46 and converts a portion of the fundamental radiation into second-harmonic radiation indicated by double arrowheads 2H. The 2H-radiation is delivered from the resonator through fold mirror 48.

Optical pump light is delivered to each OPS-chip via two optical fibers 56. Each optical fiber transports light from a dedicated diode-laser array (not shown). The pump light is focused onto the OPS-chips by a gradient index lens arrangement 58 as indicated by short-dashed lines P. The pump light is focused onto the chips in a pump-spot size that about matches the size of the beam of circulating radiation at the OPS-chips. Providing optics for focusing light onto the OPS-chips optimizes matching of pump-light energy into the circulating laser beam. However, as the OPS-chips occupy different positions in resonator 37, the mode sizes at the two chips will be different, and the focusing optics (gradient index lenses) would need to be correspondingly adjusted for optimum overall mode-matching.

Without a resonator and pumping arrangement specifically arranged for generating laser radiation from multiple OPS-chips, the efficiency of the resonator can be expected to decrease, as the number of OPS-chips that are included in the resonator is increased. Accordingly, there is a need for a resonator specifically arranged for generating laser radiation from multiple OPS chips.

SUMMARY OF THE INVENTION

In one aspect, a laser in accordance with the present invention comprises a laser-resonator having a plurality of OPS-structures (or regions) located therein. Each of the OPS-structures includes a mirror-structure surmounted by a gain-structure. An optical pumping arrangement is provided for energizing the gain-structures of the OPS-structures, thereby causing a beam of laser radiation to circulate in the laser-resonator. A plurality of fold-mirrors are located in the laser-resonator. At least one of these fold mirrors has finite optical power. The laser-resonator is folded by the fold-mirrors and the mirror-structures of the OPS-structures.

In one preferred embodiment of the inventive laser, there are five OPS-structures and five fold-mirrors. The resonator is terminated by first and second end-mirrors and is folded alternately by a gain-structure of an OPS-structure and a fold-mirror. The first end-mirror is a plane mirror and the second end-mirror and each of the fold-mirrors is a concave mirror, i.e., a mirror having positive optical power. The fold-mirrors each have the same radius of curvature and are equally spaced from the OPS-structures. The gain-structure of each OPS-structure is pumped by the output of two diode-laser bars, with the output of each of the diode-laser bars being focused to a spot on the OPS-structure by an optical arrangement including cylindrical lens-elements.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the present invention.

FIGS. 6A and 6B are respectively fast and slow-axis views schematically illustrating one preferred example of an optical pumping arrangement for optically pumping an OPS-structure of the laser of FIG. 3, the arrangement including a diode-laser bar providing pump light from a plurality of emitters, a cylindrical microlens for collimating light delivered in the fast axis of the emitters, a cylindrical microlens array for collimating light in the slow axis of the emitters and a cylindrical lens and an aspheric lens arranged to focus the fast and slow-axis collimated light onto the OPS-chip.

FIG. 7 schematically illustrates two optical pumping arrangements as depicted in FIGS. 6A-B arranged on opposite sides of the resonator plane of the laser of FIG. 3 to deliver pump light to one of the OPS chips.

DETAILED DESCRIPTION OF THE INVENTION

Figure 3:
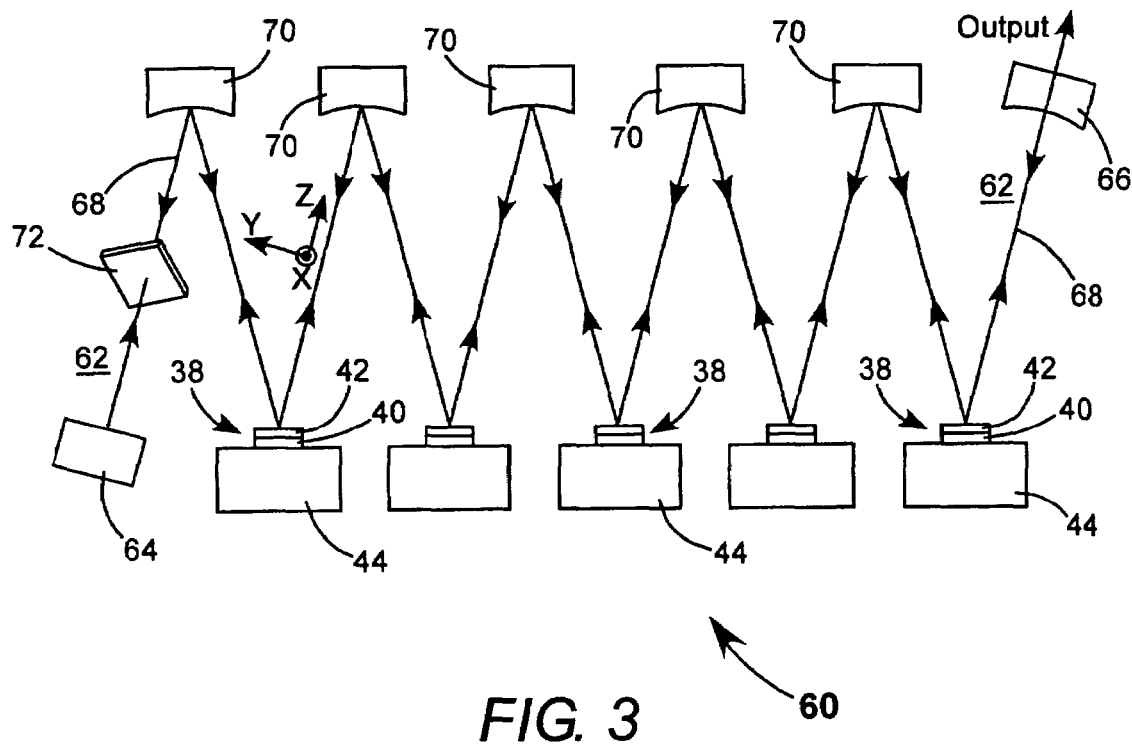
FIG. 3 schematically illustrates one preferred embodiment of an OPS-laser in accordance with the present invention having a resonator terminated by a plane end-mirror and a concave end-mirror and including five OPS-chips and five concave fold-mirrors, the resonator being ten-times folded, in a resonator plane, alternately by one of the concave fold-mirrors and one of the OPS-chips, with the concave mirrors being configured and arranged such that laser radiation circulating in the resonator has the same mode diameter at each OPS-chip.

Referring now to the drawings, wherein like components are designated by like reference numerals, FIG. 3 schematically illustrates a preferred embodiment 60 of an external cavity multiple-chip OPS-laser in accordance with the present invention. Laser 60 includes a laser resonator 62 formed between a plane mirror 64 and a concave mirror 66. Plane mirror 64 is highly reflective for the wavelength of laser radiation to be generated in the resonator. Concave mirror 66 is partially transmissive and partially reflective at the wavelength of the laser radiation and serves as an output-coupling mirror. Resonator 62 includes five OPS-chips 38, each of which has a mirror-structure 40 surmounted by a gain-structure 42. Each OPS-chip is mounted on a dedicated heat sink 44. The composition of the gain structure determines a range of wavelengths (gain-bandwidth) that can be generated by the gain-structure of the OPS chip. A birefringent filter is provided for selecting (tuning) a particular wavelength of laser radiation within this gain-bandwidth range.

A detailed description of topics such as the layer arrangement of OPS-structures, layer composition as it relates to laser wavelength for such structures and heat sink arrangements for such structures is not necessary for understanding principles of the present invention and accordingly is not provided herein. A detailed description of such topics related to high-power operation of OPS-structures is provided in above-referenced U.S. Pat. No. 6,097,742, the complete disclosure of which is hereby incorporated by reference. Further heat sinking measures such as optical contact bonding of OPS structures to heat sinks and face cooling of OPS structures via contact bonded sapphire or diamond members are described in detail in U.S. patent application Ser. No. 10/788,820 filed Feb. 27, 2004, the complete disclosure of which is also incorporated herein by reference.

Continuing with reference to FIG. 3, laser resonator 62 has a resonator axis 68 that is ten-times folded by five concave mirrors 70 and the mirror-structures 40 of the five OPS-chips 38. The resonator has a (folded) longitudinal or propagation axis Z, and Y and X-axes perpendicular to each other and perpendicular to the Z-axis. Mirrors 70 and OPS-chips 38 are aligned parallel to the Y-Z plane, here, the plane of the drawing. Laser radiation circulates generally along the folded resonator axis as indicated by closed arrowheads. The circulating radiation is incident alternately on one of the concave mirrors then on one of the OPS chips. Preferably, each of the concave mirrors has the same radius of curvature, i.e., the same focal length, and that focal length is the same as that of output-coupling mirror 66.

Spacing of the mirrors 70 and 66 from the OPS-chips, and the spacing of plane mirror 64 from an axially adjacent concave mirror 70, is not critical and is determined by a number of factors, including a desired resonator length and a desired longitudinal spacing of the OPS-chips. Generally, the greater the spacing the more stable will be the resonator. The resonator length may be determined by a desire for compactness of the laser. The spacing of the OPS-chips is determined by considerations of efficiency of heat removal and the size heat sinks 44. One suitable spacing is in a range between about 50.0 and 100.0 mm. This range should not, however, be considered limiting.

For single transverse mode operation of the inventive laser, the mode-diameter should match or be slightly greater than the pump-spot diameter. For optimum power-extraction efficiency, the mode-diameter should be less than the pump-spot diameter. This allows the laser to operate in multiple transverse modes to extract all of the available pump-light energy. It should be noted, however, that in order to optimize the efficiency of the inventive laser, it is important to match the peak-gain wavelength of the OPS-chips in any laser as closely as possible, for example, to within about plus or minus 2 nanometers (nm).

Figure 1:
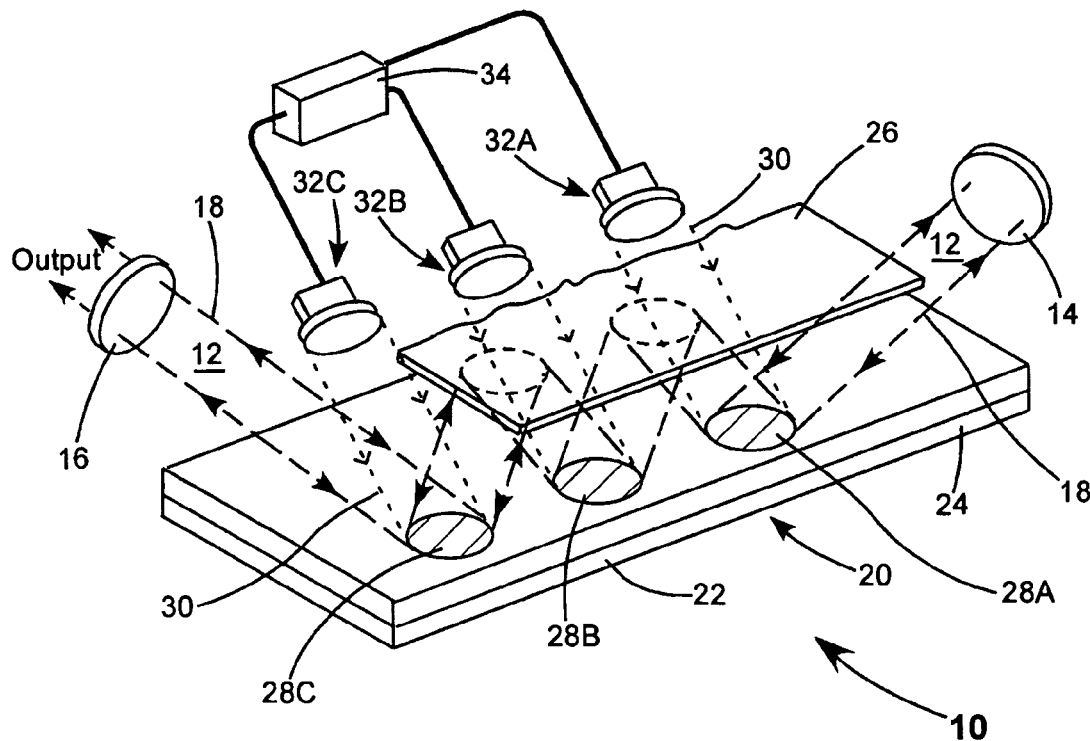
FIG. 1 schematically illustrates a prior-art OPS-laser including a laser-resonator terminated by two mirrors and including an extended OPS-structure having a mirror-structure and a gain-structure, and an extended plane mirror arranged such that laser radiation circulating in the resonator is incident on a plurality of areas of the OPS-structure, each area having a dedicated pump-light source arranged to deliver pump light to that area.
Figure 2:
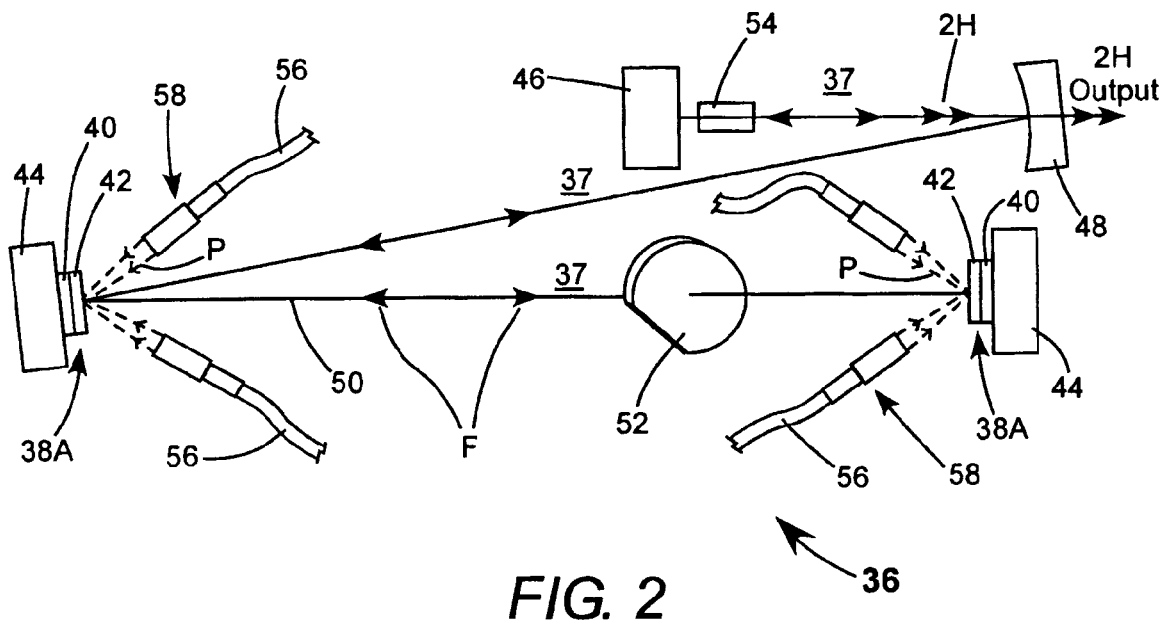
FIG. 2 schematically illustrates another prior-art OPS laser, including a laser-resonator formed between the mirror-structure of a first OPS-chip and a plane mirror, the laser having a twice-folded resonator folded by the mirror-structure of a second OPS-structure and concave mirror, and wherein pump-light is delivered to each OPS-structure via two optical fibers with light from each of the optical fibers being focused on the OPS-structure by a gradient-index-lens arrangement.
Figure 4:
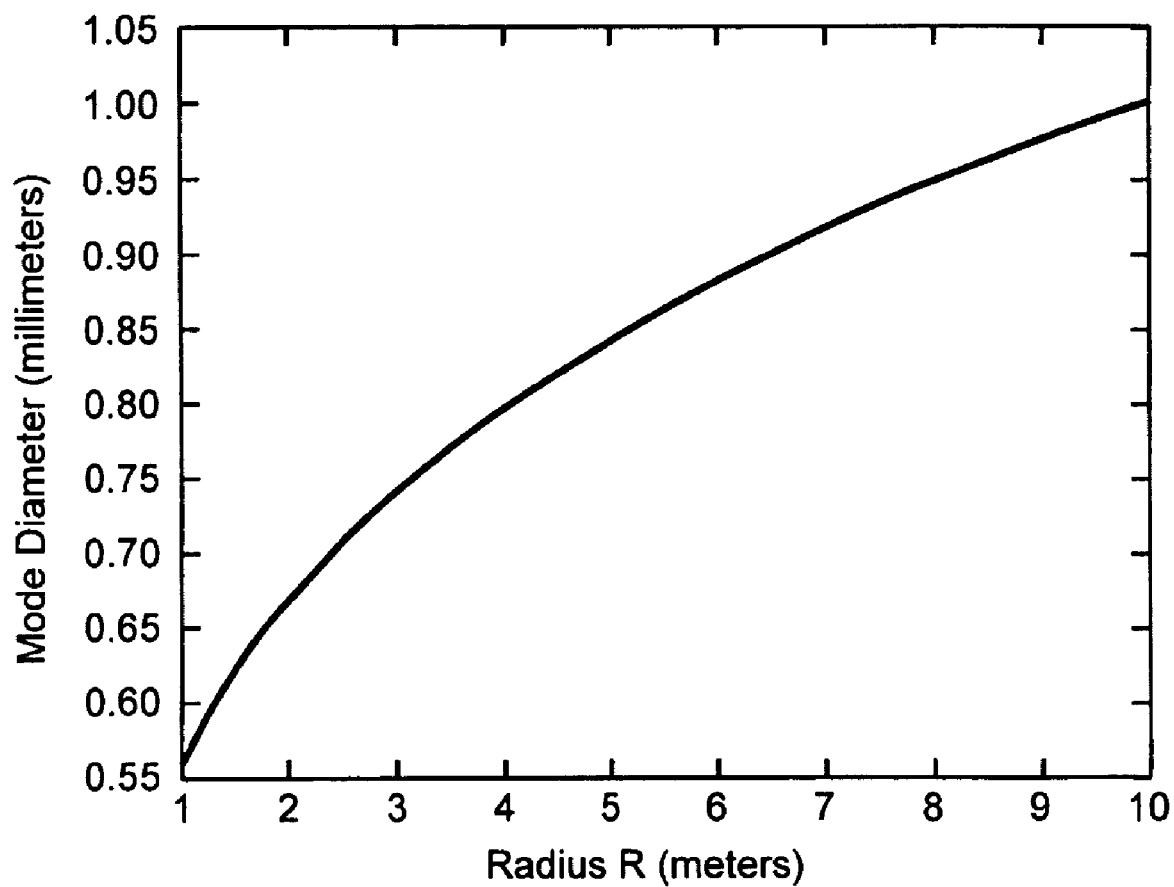
FIG. 4 is a graph schematically illustrating computed mode-diameter on the OPS chips as a function of radius of curvature of the concave mirrors in the laser of FIG. 3.

In the laser 60, the mode-diameter can be varied to match a particular pump-spot diameter by varying the radius of curvature of mirrors 70. FIG. 4 is graph schematically illustrating computed mode-diameter on OPS-chips 38 as a function of the radius of curvature mirrors 70. This illustrates a variation in mode diameter from about 0.55 millimeters (mm) to about 1.0 mm corresponding to a variation in mirror radius of curvature from about 1.0 meter (m) to about 10.0 meters. It should be noted that while the term "mode-diameter" is used here, the mode would be slightly elliptical (having a height in the Y-axis different from that in the X-axis), for example having an ellipticity of about 0.95%, as a result of the resonator configuration In FIG. 5, solid curve A schematically illustrates computed Y-axis mode-height (about one-half the "mode-diameter") as a function of position in the resonator in one example of the laser of FIG. 3 in which concave mirror 66 and mirrors 70 have a radius of curvature of about 6.0 m. The total length of the resonator (the "unfolded" Z-axis length) is about 700 mm. The position of OPS-chips 38 is depicted by short dashed lines, and the position of mirrors 70 is depicted by long-dashed lines. Concave mirror 66 is located at position zero in this graph. It can be seen that there is a variation in mode height on the OPS-chips of less than about 5% between the largest height and the smallest height. Short-dashed curve B depicts the computed mode-height as a function of resonator position in a stable resonator of the same (700 mm) length terminated by a concave mirror having a radius of curvature of 1.0 m and a plane mirror and wherein all of the fold-mirrors are plane mirrors (corresponding to the prior-art arrangement of FIG. 1). Long-dashed curve C depicts the computed mode-height as a function of resonator position in a stable resonator of 700 mm length terminated by two concave mirrors each having a radius of curvature of 1.5 m, and wherein all of the fold-mirrors are plane mirrors. It can be seen that while the arrangement of curve C provides a considerable improvement over the arrangement of curve B, there is still a substantial variation in mode-height on the OPS-chips of about 40% between the largest height and the smallest height.

Figure 5:
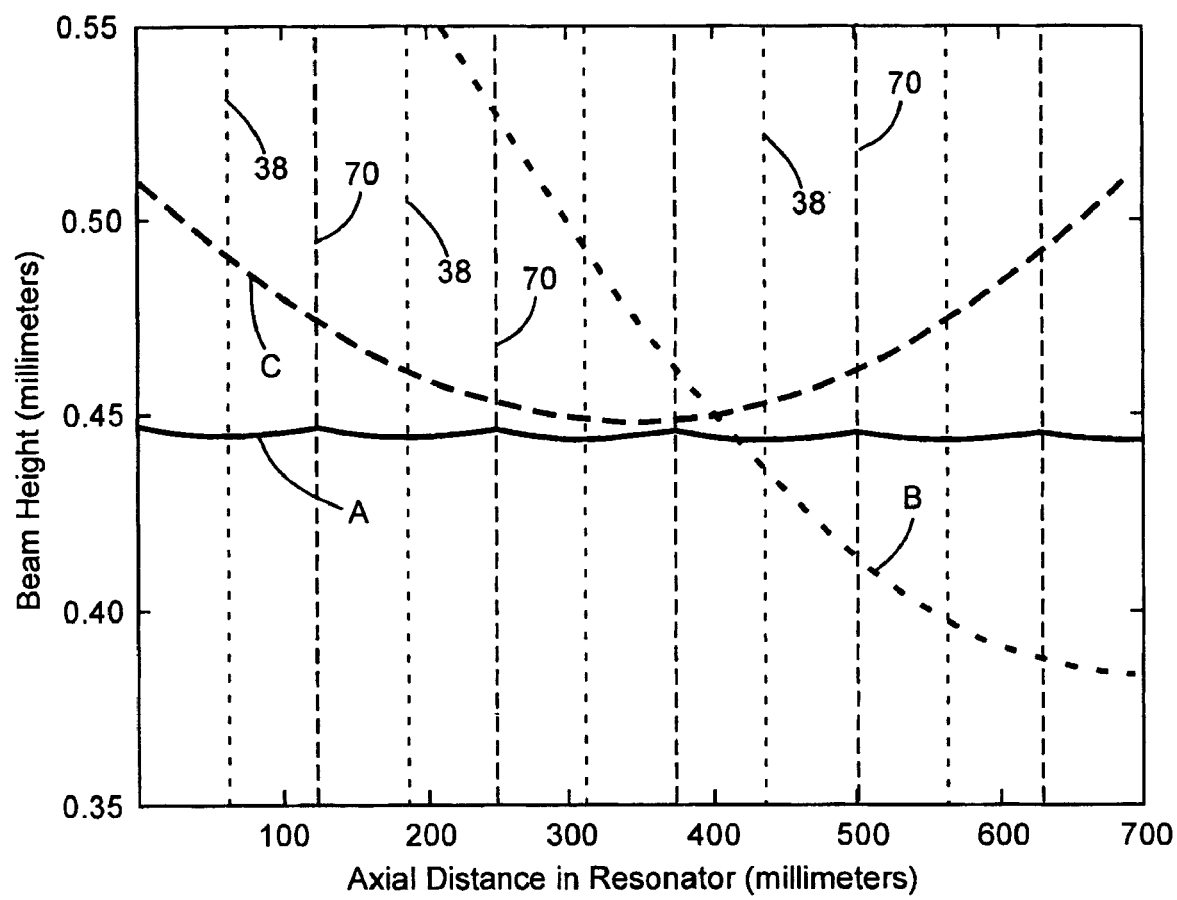
FIG. 5 is a graph schematically illustrating computed mode-height as a function of position in the resonator in one example of the laser of FIG. 3.

Those skilled in the art will recognize, from the graph of FIG. 4 and curve A of FIG. 5, that while the mode-diameter is determined by the radius of mirrors 70, the mode-diameter is essentially independent (within the above discussed minimal range of variation from largest diameter to smallest diameter) of the number of mirrors 70, and, accordingly, the number of OPS-chips in the inventive laser, provided, of course, that the mirrors have the same radius and are equally spaced from the OPS-chips. This offers the possibility of a modular approach to the design, manufacture, and assembly of a laser in accordance with the present invention. Such a modular assembly is described further hereinbelow.

Regarding such a modular approach, a particular advantage of having the same mode-diameter (mode-height) at each OPS is that a plurality of essentially identical pumping arrangements can be used for optically pumping the plurality of OPS chips. Specifically, each chip can receive the same pump power delivered into the same area. This provides that the design and configuration of any pump module used to optically pump one of the OPS-chips can be used to optically pump any other of the OPS chips with the same efficiency. Further, the thermal design and configuration for each chip and associated heat-sink can be the same. This is particularly important for optimizing the convenience and minimizing the cost of manufacturing the inventive OPS-laser.

FIG. 6A and FIG. 6B are fast-axis and slow-axis views, respectively, depicting a preferred optical pumping module 74 for a laser in accordance with the present invention. Preferably, two such optical pumping modules 74 are used to deliver pump light to each OPS-chip 38 as schematically depicted in FIG. 7, which depicts a portion of laser 60 seen in a plane perpendicular to the plane of FIG. 3.

Each pump module 74 includes a linear array of diode-lasers (diode-laser bar) 76 mounted on a heat sink 78. Individual emitters of the diode-laser bar are not shown. A cylindrical microlens 80 collimates fast-axis rays from the emitters of the diode-laser bar. An array 82 of cylindrical microlenses 84 collimates slow-axis rays from the emitters of the diode-laser bar. Only extreme ones 77F of the fast-axis rays and extreme ones 77S of the slow-axis rays are depicted in FIGS. 6A and 6B for simplicity of illustration.

The collimated slow-axis rays are brought to a focus by a slow-axis cylindrical lens 86 and a lens 88 having an aspheric surface 90 as depicted in FIG. 6B. The collimated fast-axis rays are unchanged by lens 86 and are brought to a focus by lens 88 as depicted in FIG. 6A. The fast and slow axis foci are in a common plane 92 and a pump spot 94 (beam waist) is formed in that plane. In the arrangement of FIG. 7, the pump spots 94 are preferably arranged to precisely overlap on OPS chip 38. The output beams from each pump module lie in a common plane (the plane of the paper in FIG. 7) leaving open a planar path normal to the common plane to permit the beam 68 to circulate in the resonator without interference with the pump beams.

Lens elements such as elements 86 and 88 are commercially available, for example, from Edmund Optics Inc. of Barrington, N.J. Microlenses and arrays thereof are also commercially available, for example, from Lissotchenko Mikrooptik GmbH (LIMO) of Dortmund, Germany.

Those skilled in the art will recognize that other optical arrangements may be employed for focusing the light from the diode-laser bars without departing from the spirit and scope of the present invention. By way of example, the number of optical elements may be reduced from four to as few as two if emitters in the diode-laser bar have sufficiently low divergence; if lenses 86 and 88 and replaced by a single, custom fabricated, aspheric lens element; or if focusing requirements for the pump light are relaxed.

Figure 8:
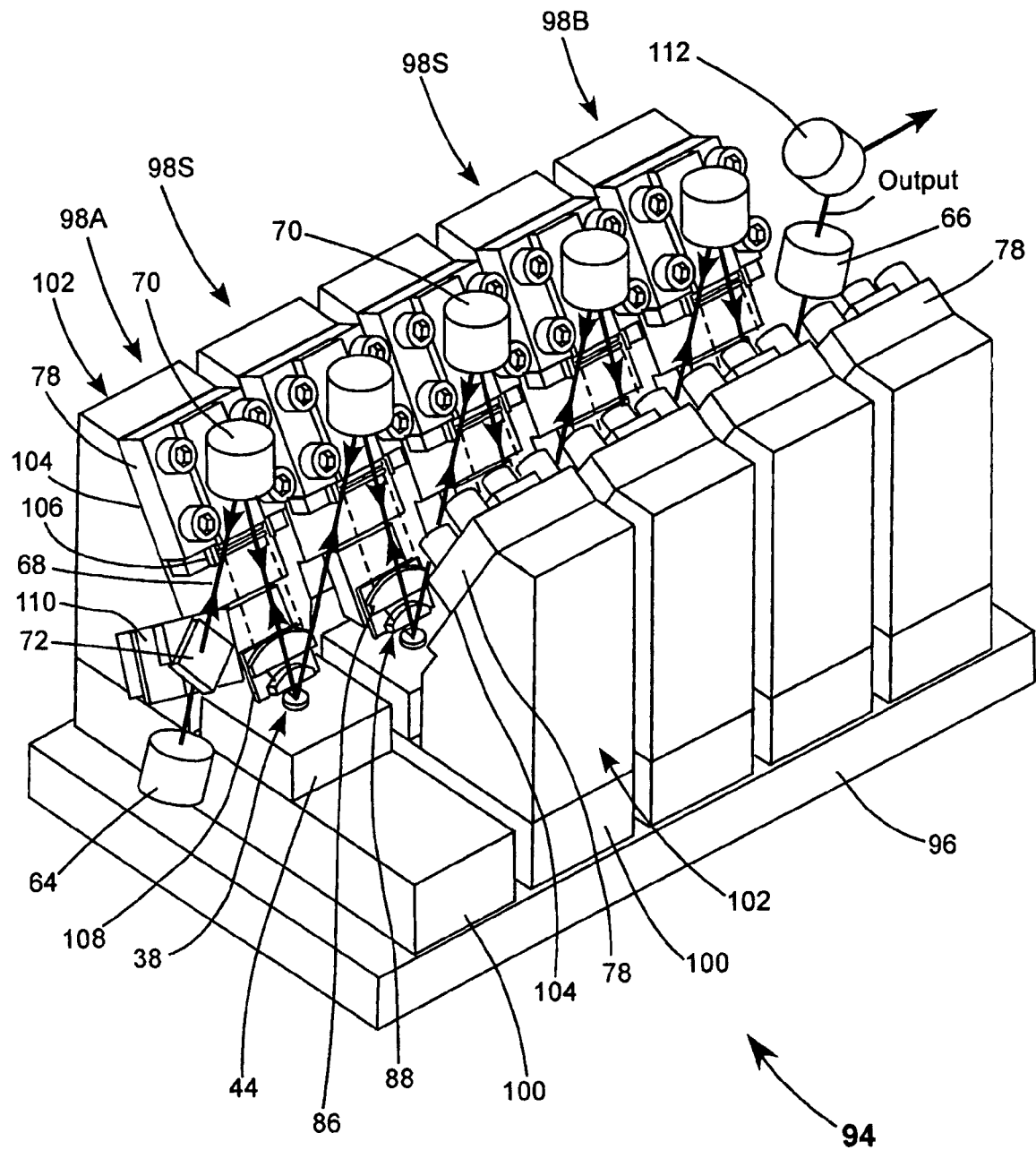
FIG. 8 is a three-dimensional view schematically illustrating a preferred modular assembly of the laser of FIG. 3 including pumping arrangements as depicted of FIG. 7.

FIG. 8 is a three-dimensional view schematically illustrating one example of a modular assembly 94 including a laser in accordance with the arrangement of FIG. 3 having the optical pumping arrangement of FIG. 7. Assembly 94 includes a flat, rigid base 96 on which are mounted five OPS-modules. End ones of the modules are designated 98A and 98B, and intermediate (supplementary) modules are designated 98S (OPS-module 98A is shown only partially complete for convenience of illustration). Each OPS-module has an elongated, rigid base 100, which is transversely mounted on base 94. Mounted centrally on each base 100 is a heat sink 44 supporting an OPS-chip 38 (see also FIG. 7). Mounted on each end of each base 100 is a support member 102 on which is mounted a pumping arrangement 74 (this general numeral is not shown in FIG. 8). Each support member 102 has a sloping surface 104 sloped to establish the angle of the pumping arrangement with respect to the OPS-chip. Clamped on the surface 104 is a heat sink 78 supporting diode-laser bar 76 (not visible in FIG. 8). Also attached to the support member is a fixture 106 for holding lens 80 and microlens array 82 (not designated in FIG. 8) in a preferred relationship with the diode-laser bar, and a fixture 108 for holding lenses 86 and 88. A separate fixture 110 attached to a support member 102 supports BRF 72.

Support structures (not shown in FIG. 8 to avoid obscuring details of the assembly of sub-modules 98) are provided for holding resonator end-mirrors 64 and 66, and folding mirrors 70 in a desired relationship with the OPS-chips 38 of the OPS-modules. In assembly 94, end-module 98A includes end-mirror 64, a fold-mirror 70, and BRF 72. End-module 98B includes concave, output-coupling mirror 66 and a fold-mirror 70, optionally, a turning-mirror 112 to direct laser output parallel to the plane of base 96. Supplementary modules 98S include a fold-mirror 70.

It should be noted here that while the present invention is described above with reference to an OPS-laser including five OPS-chips, the invention is applicable to a laser including more than five OPS-chips, and as few as two OPS-chips, with a corresponding increase or decrease in the amount of fold mirrors. In theory, there is no limit to the amount of OPS-chips that can be included in a laser in accordance with the present invention. However, a variation in the flatness of one chip can cause the mode spot position on another chip to vary and become misaligned with the pump-spot location on another chip causing a reduction in power of the laser. Clearly, the more chips that are included, the more sensitive the laser will be to any such variations in flatness of the OPS-chips that might occur temporarily, during operation of the laser, or permanently, over an extended period of use of the laser. This, among other considerations, may determine practical upper limit to the number of chips that can be included.

In the above-described modular approach to the design and manufacture of a laser in accordance with the present invention, a laser in accordance with the present invention would include, at a minimum, end-modules 98A and 98B to provide a laser including two OPS-chips 38 and two fold-mirrors 70. Note that it would be possible to configure the laser so that mirror 70 of end module 98A would terminate the resonant cavity. In this case, this mirror would be tilted with respect to the other mirrors 70.

A laser having a higher power output than could be provided by the minimum arrangement could be provided simply by adding, between the end-modules, one or more supplementary modules 98S. However, the reflectivity of output coupling mirror 66 in end-module 98B should be optimized in accordance with the total number of modules in order to extract the maximum available power from those modules.

It should be noted that the modular assembly described above 94 is just one possible assembly arrangement for the inventive laser, here, taking advantage of an arrangement where all fold mirrors 70 have the same curvature and the same spacing from the OPS-chips. Those skilled in the art may implement other assembly methods, modular or otherwise, without departing from the spirit and scope of the present invention. By way of example, in another modular assembly arrangement, one end-module may include end mirror 64 and BRF 72, and the other end module may include end mirror 66, but with neither module including an OPS-chip and associated pumping arrangements. In this modular assembly, two or more supplementary modules 98S would be arranged between the end modules according to the output power desired.

Figure 3A:
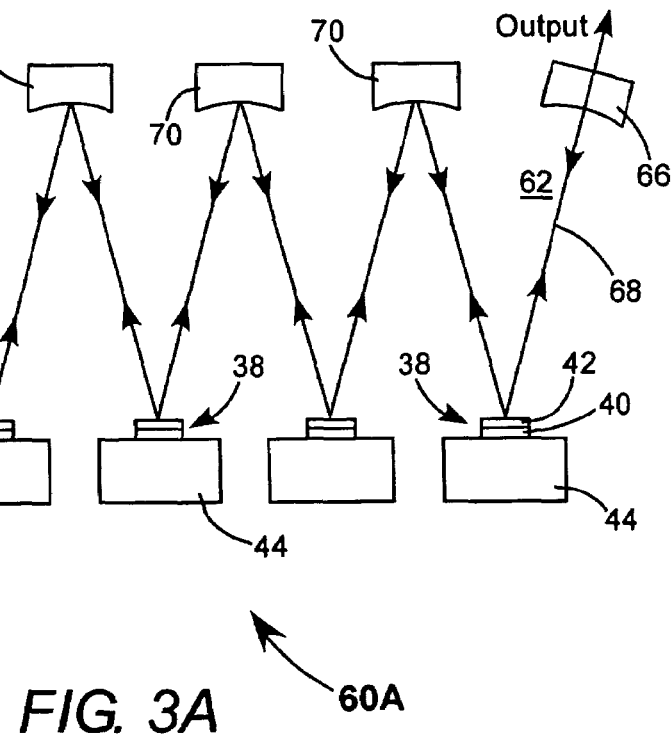
FIG. 3A schematically illustrates another preferred embodiment of an OPS-laser in accordance with the present invention but wherein the resonator includes an additional OPS-chip and the resonator is terminated by a mirror-structure of the additional OPS-chip and the concave end-mirror.

It should further be noted that it is not necessary that all fold mirrors of the inventive OPS-laser have a positive optical power, or the same optical power (radius of curvature) or have the same spacing from the OPS-chips. Some acceptable degree of uniformity of mode-diameter as a function of position in the resonator may be obtained if as few as one of the fold mirrors is a curved mirror, i.e., has a finite optical power. The actual uniformity obtained, of course, will depend on the number of chips in the resonator, the resonator length, and the curvature of the resonator end mirrors, among other factors. It is also possible in the inventive laser to replace plane end-mirror 64 with an OPS-chip as schematically depicted in FIG. 3A, thereby providing additional gain in the same laser volume. However, this, and any arrangements wherein fold mirrors have different curvatures and spacings, or less than optimum mode-diameter uniformity can be expected to complicate the design and manufacture and correspondingly increase the cost of the inventive laser. Accordingly, for commercial reasons, it is preferable to construct the laser from a plurality of substantially identical modules.

It should be noted that the embodiments shown in FIGS. 3 and 8 use separate OPS chips. However, the subject invention is not limited to this arrangement and could also be used to improve the laser of FIG. 1 where a single, extended planar semiconductor laser structure is used to create separate pumped regions. In this case, the planar reflector 26 of FIG. 1 would have to be replaced with one or more reflectors having a finite optical power, such as the concave mirrors of FIG. 3.

In summary, the present invention is described above in terms of a preferred embodiment. The invention is not limited, however, to the embodiments described and depicted. Rather, the invention is limited only by the claims appended hereto.

What is claimed is:

1. A laser, comprising:
   a laser-resonator;
   a plurality of OPS-structures located in said laser-resonator, each of said OPS-structures including a mirror-structure surmounted by a gain-structure;
   an optical pumping arrangement for energizing said gain-structures of said OPS-structures thereby causing a beam of laser radiation to circulate in said laser resonator; and
   a plurality of fold-mirrors, at least one of which has finite optical power; and
   wherein said laser-resonator is folded by said plurality of fold-mirrors and said mirror-structures of said plurality of OPS-structures and wherein said fold-mirrors and said OPS-structures are configured and arranged such that said beam of laser radiation has about the same dimensions on a plurality of said OPS-structures.

2. The laser of claim 1, wherein said laser resonator includes an additional OPS-structure having a mirror-structure surmounted by a gain-structure and said laser resonator is terminated by said mirror-structure of said additional OPS structure.

3. The laser of claim 1, wherein said laser resonator is terminated by first and second end mirrors.

4. The laser of claim 3, wherein said first end-mirror is a plane mirror and said second end mirror is a concave mirror.

5. The laser of claim 4, wherein said second end-mirror and said fold-mirrors have the same radius of curvature.

6. The laser of claim 5, wherein the number of said OPS-structures is equal to the number of said fold-mirrors.

7. The laser of claim 6, wherein each of said OPS-structures is spaced apart from a corresponding one said fold-mirrors.

8. The laser of claim 7, wherein said OPS-structures and said fold-mirrors are about equally spaced apart.

9. A laser, comprising:
   a folded laser-resonator said laser-resonator being terminated by first and second end-mirrors, and having a resonator axis;
   a plurality of OPS-structures located in said laser-resonator, each of said OPS-structures including a mirror-structure surmounted by a gain-structure;
   an optical pumping arrangement for energizing said gain-structures of said OPS-structures thereby causing a beam of laser radiation to circulate in said laser resonator;
   a plurality of concave fold-mirrors equal in number to said plurality of OPS structures, and each thereof having about the same radius of curvature; and
   wherein said resonator axis is folded by said fold-mirrors and said mirror-structures of said OPS-structures with said beam, in one direction of circulation, propagating from said first end-mirror, alternately via a said fold-mirror and a said OPS-structure, to said second end mirror and wherein said fold-mirrors and said OPS-structures are configured and arranged such that said beam of laser radiation has about the same dimensions on a plurality of said OPS-structures.

10. The laser of claim 9, wherein the axial distance between each of said fold-mirrors and an axially adjacent OPS-structure is about the same.

11. A laser comprising:
    a laser-resonator;
    a plurality of OPS-structures located in said laser-resonator, each of said OPS-structures including a mirror-structure surmounted by a gain-structure;
    an optical pumping arrangement for energizing said gain-structures of said OPS-structures thereby causing a beam of laser radiation to circulate in said laser resonator; and
    a plurality of fold-mirrors positioned such that said laser-resonator is folded by said plurality of fold-mirrors and said mirror-structures of said OPS-structures and wherein the spacing and the curvature of the fold mirrors is selected such that the size of the circulating beam is substantially the same at each OPS structure.

12. A laser comprising:
    N substantially identical modules, wherein N is equal to at least three, each module including a base upon which is mounted a heat sink, said module further including an OPS chip having a mirror structure surmounted by a gain structure, said OPS chip mounted on said heat sink, each said module further including a laser diode pump source mounted to said base for generating an output beam for exciting the OPS chip, said modules being assembled in a side to side relationship so that the OPS-chips are aligned in an array in a substantially common plane;
    at least N−1 fold mirrors aligned opposite said array of OPS chips, each fold mirror being concave with substantially the same radius of curvature; and
    a pair of resonator mirrors cooperating with the OPS chips and the fold mirrors to create a resonant cavity which propagates a laser beam from one end of the resonator to the other end and alternatively between the OPS chips and the fold mirrors in zigzag fashion.

13. The laser as recited in claim 12, wherein the spacing and curvature of the fold mirror mirrors is selected so that the size of the circulating beam at each OPS chip is substantially the same.

14. The laser as recited in claim 12, wherein the laser diode pump source is in the form of two laser diode arrays, the arrays being positioned so that two respective output beams are emitted therefrom are directed at an angle to the surface of the OPS chip and wherein the two output beams lie in a common plane leaving open a planar path normal to said common plane to permit the beam to circulate in the resonator without interference with the pump beam.

* * * * *